United States Patent [19]

Anzai

[11] Patent Number: 5,335,196
[45] Date of Patent: Aug. 2, 1994

[54] SEMICONDUCTOR MEMORY DEVICE HAVING MEMORY CELLS FORMED OF ONE TRANSISTOR AND ONE CAPACITOR AND A METHOD OF PRODUCING THE SAME

[75] Inventor: Kenji Anzai, Sagamihara, Japan

[73] Assignee: Nippon Steel Corporation, Tokyo, Japan

[21] Appl. No.: 49,497

[22] Filed: Apr. 21, 1993

[30] Foreign Application Priority Data

Apr. 23, 1992 [JP] Japan ................................. 4-130003

[51] Int. Cl.$^5$ ............................................. G11C 11/24
[52] U.S. Cl. ................................. 361/149; 365/189.01
[58] Field of Search ................ 365/149, 189.01, 230.01

[56] References Cited

U.S. PATENT DOCUMENTS 4,801,989  1/1989  Taguchi .............................. 365/149

FOREIGN PATENT DOCUMENTS 4-62870  of 0000  Japan .

*Primary Examiner*—Terrell W. Fears
*Attorney, Agent, or Firm*—Pollock, Vande Sande & Priddy

[57] ABSTRACT

A semiconductor memory device having transistors and capacitors on a semiconductor substrate with the lower electrodes and the contact holes for connection with the sources of the transistors formed on a self-alignment basis and a method of producing the same are disclosed. The transistor of the semiconductor memory device formed on the semiconductor substrate has a first insulating layer, a gate electrode, a source portion and a drain portion. The source and drain portions dispose in the vicinity of the gate electrode, on opposite sides of each other relative to the gate electrode, under the first insulating layer and in the semiconductor substrate. The capacitor of the semiconductor memory device has a lower electrode connecting with the source portion, a second insulating layer between the lower electrode and the upper surface of the gate electrode, a third insulating layer covering the source-side sidewall of the second insulating layer and that of the gate electrode, and a fourth insulating layer covering the drain-side of the upper surface and the source-side sidewall of the second insulating layer and that of the gate electrode. Displacement from the upper surface of the insulator on the gate electrode to the source portion is large and the slope is long enough so that the lower electrode of the capacitors formed on the slope may have a relatively large surface and the clearance between the gate electrode and the contact hole for connection with the lower electrode may be significantly reduced.

13 Claims, 3 Drawing Sheets

SEMICONDUCTOR MEMORY DEVICE HAVING MEMORY CELLS FORMED OF ONE TRANSISTOR AND ONE CAPACITOR AND A METHOD OF PRODUCING THE SAME

BACKGROUND OF THE INVENTION

1. Field of the Invention

This invention relates to semiconductor memory devices such as DRAMs (dynamic random access memories), particularly those having memory cells formed of one transistor and one capacitor, and a method of producing the same.

2. Description of the Related Art

The semiconductor memory device has been demanded to have a larger scale capacity and high speed operation capability as information equipment is developed. In order to respond to this demand, high integration, high speed response and high reliability are required for the semiconductor memory device. Particularly the memory cell array for storing information data must be absolutely integrated at a very high density. However, in the conventional semiconductor memory device, particularly in DRAM having memory cells formed of a transistor and a capacitor, the contact holes through which information lines are connected to the sources or the drains of the transistors must be separated by a certain distance or above from the gate electrodes of the transistors in order not to be made in contact therewith, and thus the memory cells should have design margins in size allowing for this separation.

FIGS. 4 and 5 show the structure of conventional stacked capacitor cells used in a one-transistor/one-capacitor type DRAM. In a method of producing this structure, the gate electrodes, or word lines 12 of MOS transistors 11 which constitute memory cells, are covered by an interfacial isolation film 13, and a photoresist (not shown) is coated over the entire surface of the substrate. Then, the photoresist is patterned by photolithography so that contact holes 15 can be later bored in the interfacial isolation film at the locations corresponding to the sources 14a of the MOS transistors 11.

Then, the interfacial isolation film 13 and the gate insulating film thereunder are selectively etched with this patterned resist used as a mask, so that the contact holes 15 are bored in those films. Thereafter, lower electrodes 17, insulating films 21 and upper electrodes 22 of capacitors 16 which constitute memory cells are deposited sequentially. In addition, the upper electrodes 22 are covered by an interfacial isolation film 23, and contact holes 24 reaching the drains 14b of the MOS transistors 11 are bored in the interfacial isolation film 23. Then, bit lines 25 are formed on the interfacial isolation film covering the holes.

FIGS. 4 and 5 show a pair of memory cells formed in one active region, which are formed by two MOS transistors 11 sharing one drain and serving as access transistors for the corresponding capacitors respectively.

In the conventional structure mentioned above, however, since the contact holes 15 are formed by photolithography, it is difficult to precisely bore the contact holes because of unsufficient precision of mask alignment in exposure. Therefore, a considerably large design margin 26 is necessary between the word line 12 and the contact hole 15 For example, under 1 μm level design rules, the design margin 26 is required 0.5 through 1.0 μm. This large design margin becomes a great interference with the memory cell area reduction for high-density DRAMs.

SUMMARY OF THE INVENTION

Accordingly, it is an object of the invention to provide a method of producing a semiconductor memory device in which the contact hole for coupling the source of each transistor and the lower electrode of the associated capacitor can be formed on a self-alignment basis, thereby providing a semiconductor memory device having a reduced memory cell area.

In order to solve the above problems, according to this invention, there is provided a semiconductor memory device formed on a semiconductor substrate having memory cells for recording information each of which is formed of a special transistor and a special capacitor with insulating layers. The transistor includes a first insulating layer formed on the semiconductor substrate, a gate electrode formed on the first insulating layer, a source portion formed within the semiconductor substrate and under the first insulating layer so as to be adjacent to the gate electrode and a drain portion formed within the semiconductor substrate and under the first insulating layer so as to be adjacent to the gate electrode and to oppose the source portion with the gate electrode being interposed between the source portion and the drain portion. The capacitor includes a lower electrode made in contact with the source portion. And the memory cell further has a second insulating layer formed between the gate electrode and the lower electrode, a third insulating layer covering the side surfaces of the second insulating layer and the gate electrode facing to the lower electrode, and a fourth insulating layer covering the upper and side surfaces of the second insulating layer and the side surface of the gate electrode facing to the drain portion.

According to the invention, there is provided a method of producing the semiconductor memory device including the steps of depositing a first insulating film for a gate insulating film on a semiconductor substrate of a first conductivity type, forming a gate electrode on the first insulating film, doping an impurity of a second conductivity type into the semiconductor substrate at both sides of the gate electrode to form impurity regions, depositing a second insulting film over the entire surface of the semiconductor substrate including the entire surface of the gate electrode, forming an etching mask with holes which are aligned with an area ranging from at least the upper portion of the gate electrode to one of the impurity regions, etching the first and second insulating films through the etching mask in the direction substantially vertical to a surface of the semiconductor substrate so that a side wall spacer is formed of the second insulating film left on one side of the gate electrode and that the first and second insulating films on the outside of the side wall spacer and on the one impurity region are removed to make a contact hole reaching the semiconductor substrate, and depositing lower electrodes for capacitors, after removing the etching mask, over the substrate in order to be made in contact with the one impurity region through the contact hole formed by the step of etching.

In the semiconductor memory of the invention, since the slope from the insulator on the gate electrode down to the source region has a high gradient and is long, the lower electrode of the capacitor formed thereover has a relatively large surface area. It results in larger capacity of the capacitors relative to the substrate surface. In addition, the distance between the gate electrode and the contact hole connecting the lower electrode can be sufficiently reduced. Therefore, the invention enables reduction in area of the memory cells in semiconductor memory.

In the method of producing the semiconductor memory of the invention, the side wall spacers can be formed as the insulating films between the gate electrode of the transistor and the lower electrode of the capacitor, and also the contact hole can be formed immediately on the outside of the side wall spacer on a self alignment basis. Thus, there is no need to provide a large design margin between the gate electrode and the contact hole as in the prior art.

DESCRIPTION OF THE PREFERRED EMBODIMENTS

The semiconductor memory device and the producing method thereof according to the invention will be described with reference to the drawings in case of being applied on DRAM (dynamic random access memory).

Figure 1A:
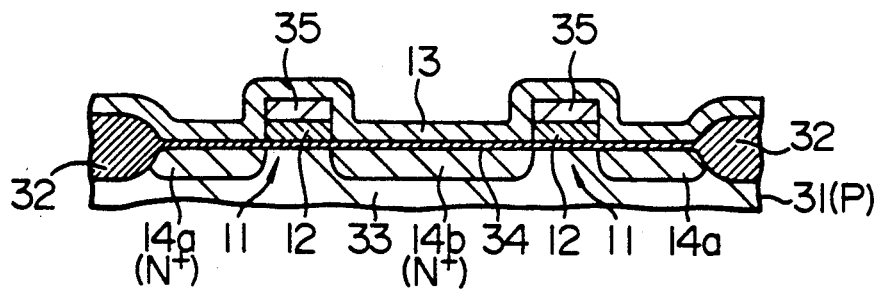
FIG. 1A is a cross-sectional diagram of an enlarged main portion of a semiconductor memory showing the first step of the method of producing the semiconductor memory of the invention.

As illustrated in FIG. 1A, a field oxide film 32 of silicon oxide $SiO_2$ is formed in the isolation region of a polycrystalline Si substrate 31 of P-type, and then a gate oxide film 34 of about 10 through 20 nm in thickness is formed on the surface of an active region 33.

In addition, a polycrystalline Si film of about 100 through 300 nm is deposited with phosphor doped in high density, and subsequently an $SiO_2$ film of about 100 through 500 nm, preferably 200 through 500 nm in thickness are deposited over the entire surface by CVD (chemical vapor deposition). Then the films are patterned so as to form the gate electrodes, or word lines 12 of polycrystalline silicon Si film for MOS (metal oxide semiconductor) transistors 11. And in result, the word lines 12 are covered with an insulating films 35 of $SiO_2$. The polycrystalline Si film may be replaced by a polycide film, and the $SiO_2$ film may be replaced by an SiN film of about 50 through 100 nm in thickness.

Thereafter, ion implantation is performed in the substrate with the word lines 12, insulating film 35 and field oxide film 32 used as the mask, so that the N+ type sources and drains 14a and 14b of MOS transistors 11 can be formed within the active regions 33. Then, an $SiO_2$ film of about 200 through 300 nm in thickness is deposited over the entire surface of the substrate by CVD so as to form the interfacial isolation film 13.

Figure 1B:
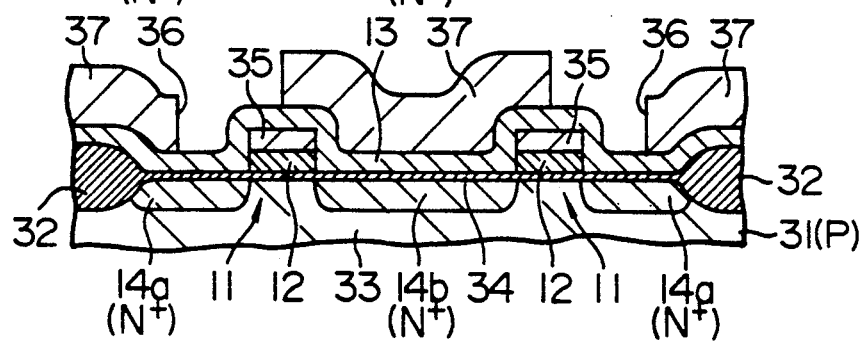
FIG. 1B is a cross-sectional diagram showing the second step of the method of producing the semiconductor memory of the invention.

Moreover, as shown in FIG. 1B, a resist 37 is coated over the interfacial insulating film 13, and holes 36 sized to spread over at least a part of the source 14a of MOS transistor 11 and a part of the word line 12 are bored in the resist film by photolithography.

Figure 1C:
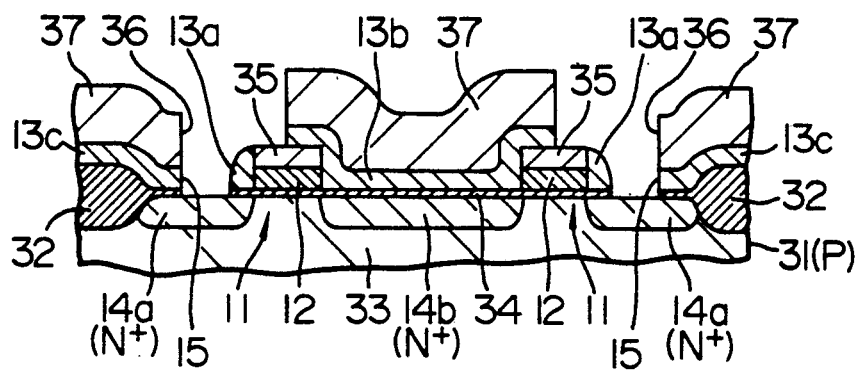
FIG. 1C is a cross-sectional diagram showing the third step of the method of producing the semiconductor memory of the invention.

Also, as shown in FIG. 1C, with the mask of this resist 37 the interfacial isolating film 13 and gate oxide film 34 are selectively etched in the direction perpendicular to the surface of the Si substrate 31. As a result, the interfacial isolating film 13 within the holes is left at a side of the word line 12 and the insulating film 35 to have a width substantially equal to the thickness of the interfacial isolating film 13. That is, side wall spacers 13a of about 0.15 through 0.3 μm in width are formed on the one side of the word lines 12 and insulating films 35, and the contact holes 15 are bored immediately on the outer side of the side wall spacers 13a.

And portion 13b of the insulating film 13 is left on the drain electrode 14b covered by the resist 37 and also portion 13c on the field oxide film 32.

If considering only the etching stopper function, the insulating film 35 is preferable to be formed with SiN so as to be thinner as described above, but considering the capacitor construction, it is preferably formed with $SiO_2$ so that the height, i.e. the capacitor area, can be increased by the thickness, as will be described later. In other words, the area of the electrodes of capacitors to be formed on the insulating film is increased, and hence the capacitance is also increased, with the increase of the depth of the contact holes.

Figure 1D:
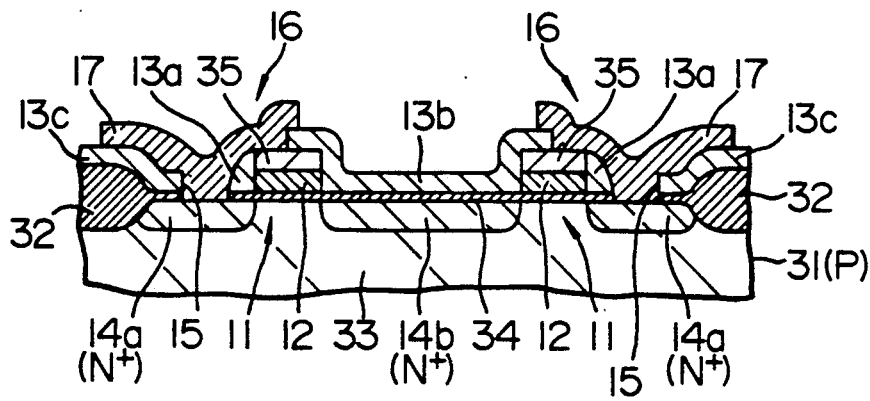
FIG. 1D is a cross-sectional diagram showing the fourth step of the method of producing the semiconductor memory of the invention.

Then, as shown in FIG. 1D, the resist 37 is removed, and a polycrystalline silicon film of about 200 through 300 nm in thickness is deposited over the entire surface by the low pressure CVD. Simultaneously, an N-type impurity is doped into the polycrystalline Si film. The polycrystalline Si film is patterned, and the lower electrodes 17 of the capacitors 16 are formed to connect with the sources 14a of the MOS transistors 11 through the contact holes 15.

Figure 2:
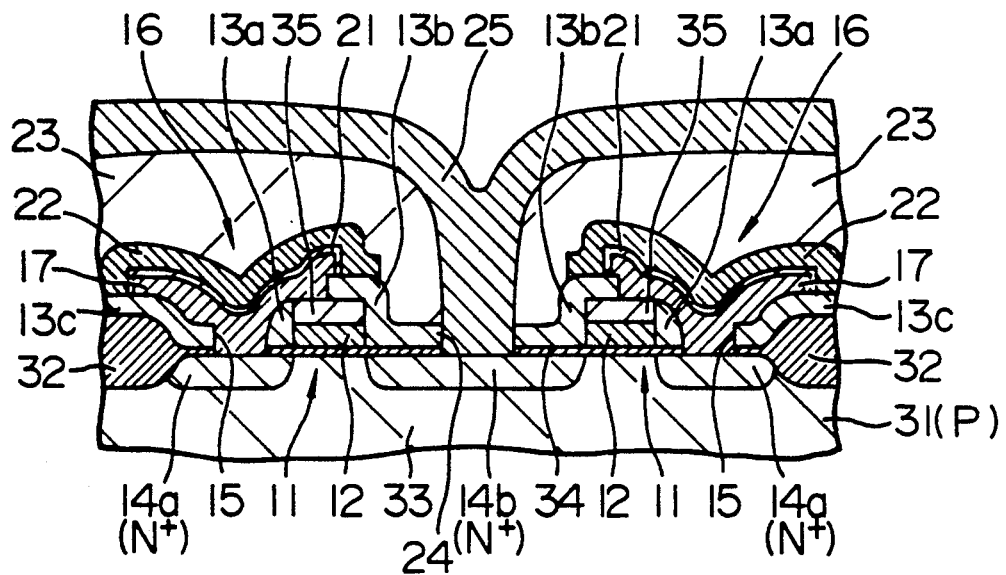
FIG. 2 is a cross-sectional diagram taken along a line II—II in FIG. 3, showing the structure of the main portion of the semiconductor memory produced by the method of the invention as illustrated in FIGS. 1A through 1D.
Figure 3:
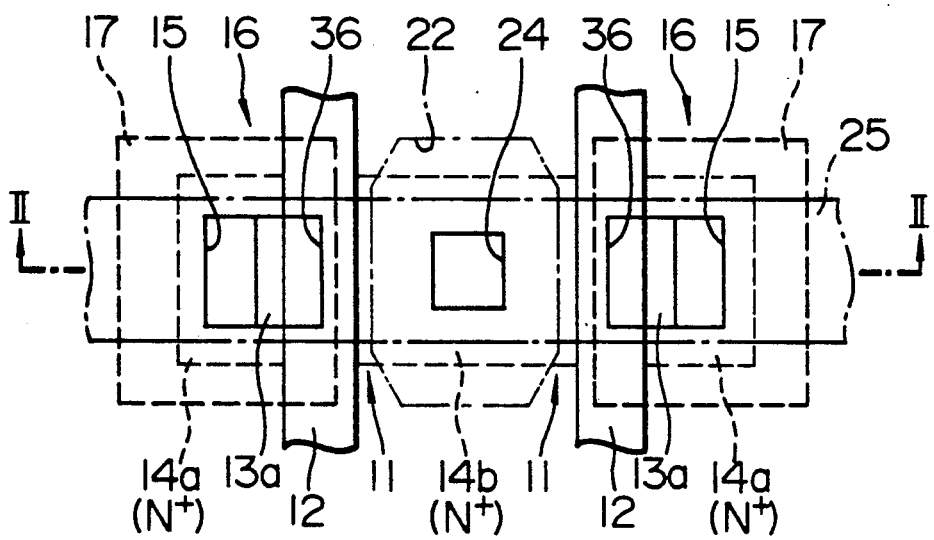
FIG. 3 is a schematic plan view of the semiconductor memory of FIG. 2.
Figure 4:
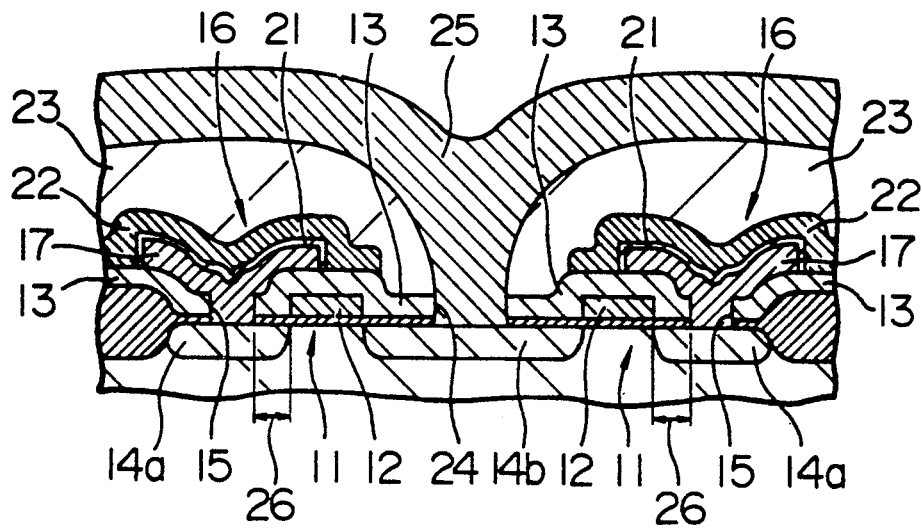
FIG. 4 is a cross-sectional diagram of the conventional semiconductor memory taken along a line IV—IV in FIG. 5.
Figure 5:
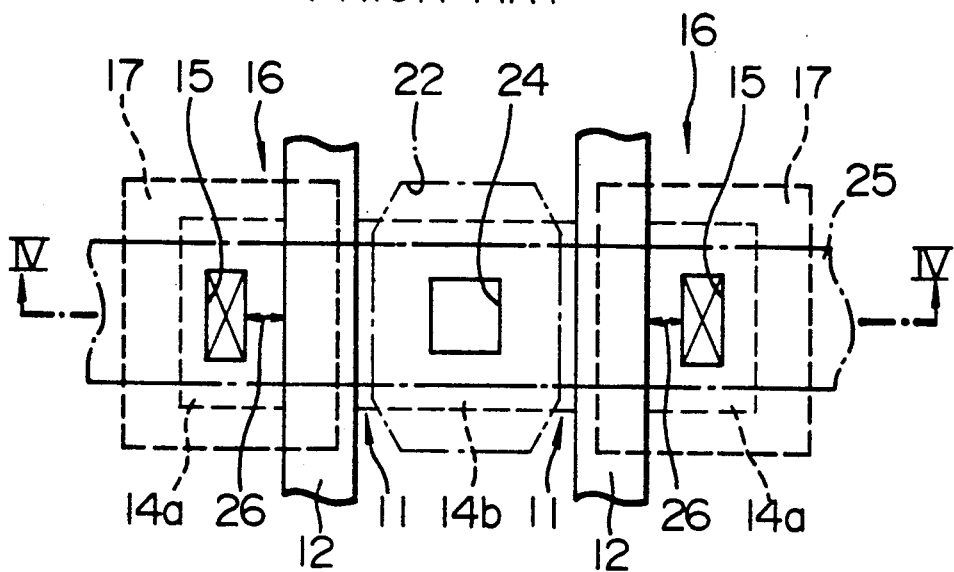
FIG. 5 is a schematic plan view of the conventional stacked capacitor cell of FIG. 4.

Thereafter, as shown in FIGS. 2 and 3, the insulating film 21 and upper electrode 22 for the capacitors are formed subsequently on the lower electrodes of the capacitors, and then the upper electrodes 22 are covered by the interfacial isolating film 23. In addition, contact holes 24 are bored in this interfacial isolating film 23 so as to reach the drains 14b of the MOS transistors 11. Then, an Al film is deposited over the holes to form bit lines 25 which are connected to the drains of MOS transistors.

Thus, according to the production method of the invention mentioned above, when the side wall spacers 13 are formed on the one side of the word lines 12, the contact holes 15 are bored immediately on the outer side of the side wall spacers 13 on a self alignment basis. Therefore, the resist 37 can be relatively roughly patterned, and there is no need to provide a large design margin between the word line 12 and the contact hole 15 as in the prior art.

According to the method of producing the semiconductor memory device of the invention, since the large design margin is not necessary to be provided between the gate electrode of the transistor and the contact hole through which the lower electrode of the capacitor is connected to the source of the transistor, it is possible to reduce the area for the memory cells of the semiconductor memory device.

The relatively large capacity of the capacitors of the invention per unit area of the substrate and the reduced clearance between the gate electrodes and the contact holes for connection with the lower electrodes may provide a remarkable reduction in area of the memory cells in semiconductor memory devices.

What is claimed is:

1. A semiconductor device having memory cells for recording informations in cooperation with transistors and capacitors formed on a semiconductor substrate, each of said memory cells comprising:
   a transistor having:
   a first insulating layer formed on said semiconductor substrate,
   a gate electrode formed on said first insulating layer,
   a source portion formed within said semiconductor substrate and under said first insulating layer so as to be adjacent to said gate electrode, and
   a drain portion formed within said semiconductor substrate and under said first insulating layer so as to be adjacent to said gate electrode and opposite to said source portion in relation to said gate electrode;
   a capacitor having a lower electrode made in contact with said source portion;
   a second insulating layer formed under said lower electrode and on an upper surface of said gate electrode;
   a third insulating layer covering side surfaces facing said source portion of said second insulating layer and of said gate electrode; and
   a fourth insulating layer covering side surfaces facing said drain portion of said second insulating layer and of said gate electrode and a drain side of upper surface of said second insulating layer.

2. The semiconductor device according to claim 1, said lower electrode being formed in contact with said fourth insulating layer of a portion on said drain side of upper surface of said second insulating layer, said second insulating layer and said third insulating layer.

3. The semiconductor device according to claim 2, said memory cell further comprising a fifth insulating layer on said lower electrode for functioning as an insulating film for the capacitor.

4. The semiconductor device according to claim 3, said memory cell further comprising an upper electrode on said fifth insulating layer to form a capacitor in cooperation with said lower electrode.

5. The semiconductor device according to claim 3, each of said first through fifth insulating layers comprising a silicon oxide layer.

6. The semiconductor device according to claim 2, said device further having a field oxide film in said semiconductor substrate for separating adjacent transistors with each other, and said lower electrode extending to a portion on said field oxide film.

7. The semiconductor device according to claim 6, said device further having a sixth insulating layer between said field oxide film and said lower electrode, said sixth insulating layer comprising a same component as that of said third insulating layer field oxide film.

8. A semiconductor device having memory cells for recording informations in cooperation with transistors and capacitors formed on a semiconductor substrate, each of said memory cells comprising:
   a transistor having:
   a first insulating layer formed on said semiconductor substrate,
   a gate electrode formed on said first insulating layer,
   a second insulating layer formed on said gate electrode,
   a source portion formed within said semiconductor substrate and under said first insulating layer so as to be adjacent to said gate electrode,
   a third insulating layer covering a side surface facing said source portion of said second insulating layer and a side surface facing said source portion of said gate electrode,
   a drain portion formed within said semiconductor substrate and under said first insulating layer so as to be adjacent to said gate electrode and opposite to said source portion in relation to said gate electrode, and
   a fourth insulating layer covering an upper surface and a side surface facing said drain portion of said second insulating layer and a side surface facing said drain portion of said gate electrode; and
   a capacitor having a lower electrode, said lower electrode formed in contact with said source portion, said second insulating layer, said third insulating layer and an upper surface of said fourth insulating layer covering said upper surface of said second insulating layer.

9. The semiconductor device according to claim 8, said memory cell further comprising a fifth insulating layer on said lower electrode for functioning as an insulating film for the capacitor.

10. The semiconductor device according to claim 9, said memory cell further comprising an upper electrode on said fifth insulating layer to form a capacitor in cooperation with said lower electrode.

11. The semiconductor device according to claim 9, each of said first through fifth insulating layers comprising a silicon oxide layer.

12. The semiconductor device according to claim 8, said device further having a field oxide film in said semiconductor substrate for separating adjacent transistors with each other, and said lower electrode extending to a portion on said field oxide film.

13. The semiconductor device according to claim 12, said device further having a sixth insulating layer between said field oxide film and said lower electrode, said sixth insulating layer comprising a same component as that of said third insulating layer field oxide film.

* * * * *